United States Patent [19]

McPherson et al.

[11] Patent Number: 4,831,211

[45] Date of Patent: May 16, 1989

[54] EMI/RFI SEALED MICROPHONICS ISOLATION APPARATUS AND METHODS

[75] Inventors: Larry D. McPherson, Allen; Eliseo Saenz, Garland, both of Tex.

[73] Assignee: Rockwell International Corporation, El Segundo, Calif.

[21] Appl. No.: 203,846

[22] Filed: Jun. 8, 1988

[51] Int. Cl.⁴ .......................... H05K 9/00; H05K 5/04
[52] U.S. Cl. ................................ 174/35 R; 174/52.1; 331/67; 331/68
[58] Field of Search .......... 174/35 R, 35 GC, 35 MS, 174/50, 52.1, 52.3; 330/68; 331/67, 68; 361/424

[56] References Cited

U.S. PATENT DOCUMENTS 4,091,232  5/1978  Lenk et al. ..................... 331/68 X Primary Examiner—Laramie E. Askin
Attorney, Agent, or Firm—Bruce C. Lutz; V. Lawrence Sewell; H. Fredrick Hamann

[57] ABSTRACT

A conductive and mechanical energy absorbing gasket is used between an electronics package and a cover of an enclosure to provide microphonics isolation. The electronics package is secured to the cover via a gasket using isolation damping grommets and screws, so that the only substantial transmission of mechanical energy from the case to the electronic package is through the screws themselves. The conductivity of the gasket places the entire enclosure at the same potential as the metal in the electronic package and as the mounting screws, and thus helps prevent the screws from acting as RF antennas.

5 Claims, 2 Drawing Sheets

EMI/RFI SEALED MICROPHONICS ISOLATION APPARATUS AND METHODS

THE INVENTION

The present invention is related generally to electronics, and more specifically to packaging of electronics to prevent the emission of EMI (electromagnetic interference) signals. Even more specifically, the invention is related to the EMI packaging of an electronic module to minimize the generation of microphonics induced signals in the enclosed module.

BACKGROUND

The prior art packaging of an electronic oscillator-type module inside a shielding chassis comprised the internal mounting and isolation of the module along with the difficulty of access to the shielded module even when the cover of the package was removed and the volume required of the chassis to accomodate the mounting hardware.

The present invention overcomes the limitations of the prior art by attaching the electronic module to the cover of the enclosure and using a conductive, shock-absorbing gasket to place the electronic module and the cover at the same potential. The gasket extends to the edges of the cover, so that the rest of the chassis is also placed at the same potential. Since the gasket is shock absorbing, the only source of oscillation inducing mechanical impulses that can reach the module has to be applied through the mounting screws. This source of microphonics is minimized by using isolation grommets between the module mounting screws and the cover. Since the module is mounted to the cover, the removal of the cover from the remaining part of the shield allows access to the surface of a majority of the module.

It is thus an object of the present invention to provide a more compact interference signal shielding package for an electronic module with attention given to the minimization of application of microphonics inducing mechanical impulses.

Other objects and advantages of the present invention will be apparent from a reading of the specification and appended claims in conjunction with the drawings wherein:

FIG. 1 is an isometric view of a shielding cover and container for an electronic module; and FIG. 2 is a cross-sectional view through a portion of FIG. 1 taken in the direction of line 2—2.

DETAILED DESCRIPTION

Figure 1:
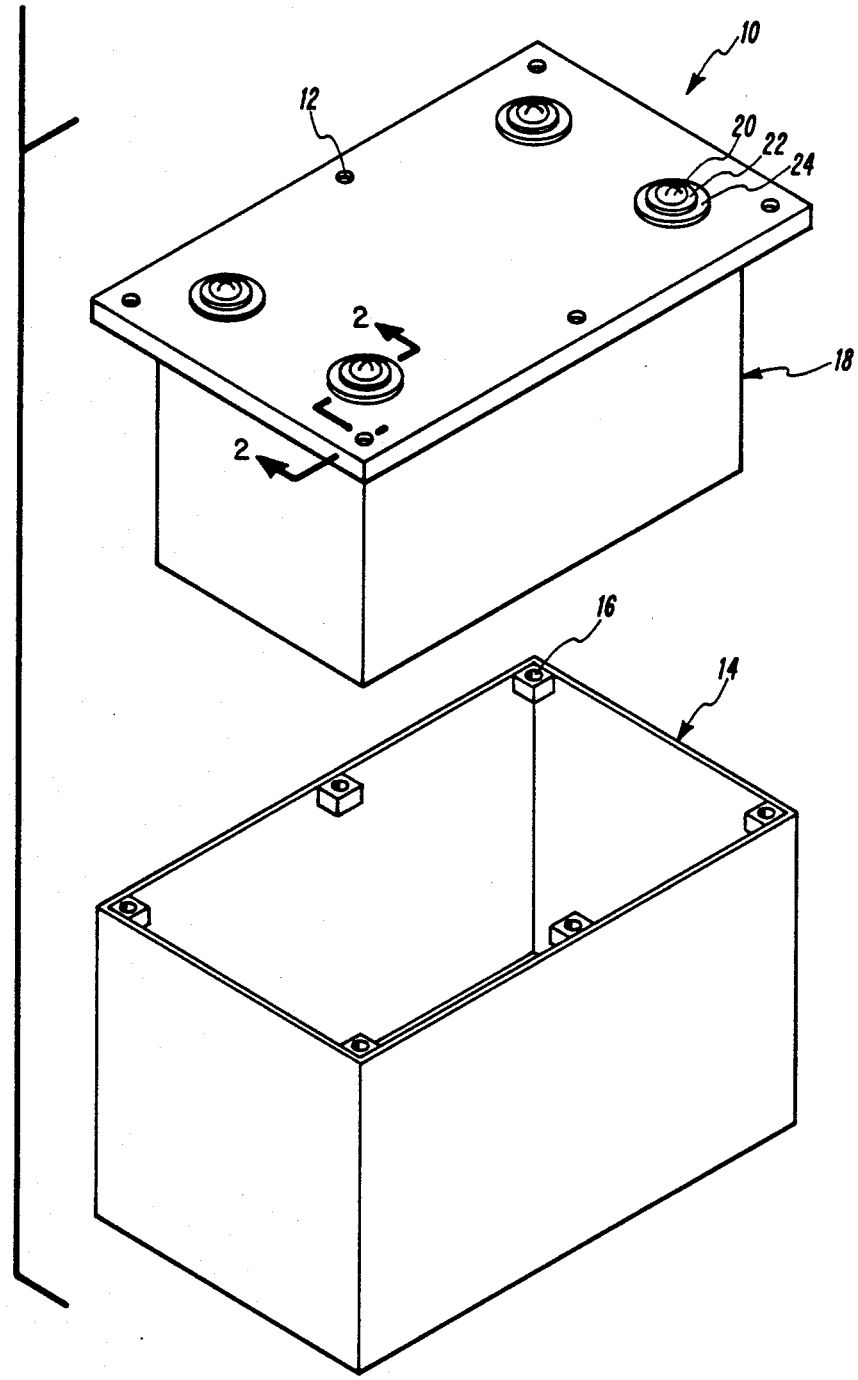
Figure 2:
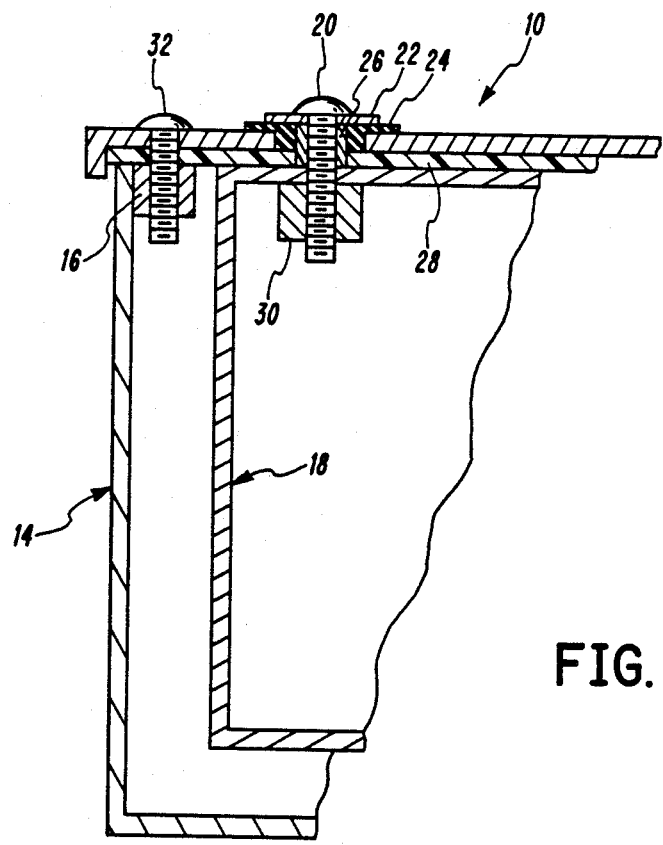

In FIG. 1, a cover generally designated as 10, has six openings, designated as 12, for use in mounting the cover to a remaining box-like enclosure, generally designated as 14. Box 14 has a plurality of threaded receptacles, such as 16, which cooperate with fastening devices, such as screws, to hold the cover 10 firmly in place and attached to box 14. An electronic module, generally designated as 18, is attached to cover 10 by a plurality of screws, such as screw 20, which is mounted through a washer 22 and an isolation grommet 24 to electronic module 18. As will be apparent from FIG. 2, it will be noted that a sleeve 26 is placed around the shank of screw 20, between washer 22, and the surface of module 18, to prevent compressing the grommet 24 and a conductive gasket, designated as 28, by more than a predetermined amount. A nut 30 within the module 18 is threaded to cooperate with the screw 20 to provide the compressive force. A screw 32 at the edge of cover 10 cooperates with the nut 16 on the edge of box 14 to compress the gasket 28 between the cover 10 and the box 14, whereby the conductivity and compressibility of the gasket 28 prevents the emission of EMI signals and maintains the entire enclosure at the same potential.

As will be apparent, if the head of the screw 20 were of a larger diameter, the force distributing action of the washer 22 would not be necessary and thus the washer could be eliminated. As previously indicated, the gasket 28 is conductive as well as being somewhat shock absorbing.

As used herein, the gasket 28 is an elastomer having a durometer range between 40 and 70. As used in this specification, elastomer is a name applied to a variety of natural and synthetic products, and used particularly in scientific and technical literature as a name for both natural and synthetic materials which are elastic or resilient, and in general, resemble natural rubber in texture and appearance. As is well-known to those skilled in the art, the durometer measurement is a measurement of the hardness of an elastomer or other substance or the degree of resistance to penetration of the substance. The appropriate durometer reading for an elastomer, as used herein, would be such that it would allow for low force compression of the material such as would be experienced during vibration. The durometer reading must be high enough so that it does not have excessive compression for a given force. Otherwise, the module within the box container will be allowed excessive motion with respect to the cover 10.

The term microphonics is used herein to describe frequency related anomalies of an oscillator caused by physical shock and vibration. These vibrations can cause numerous types of physical changes in the electronic oscillator assembly that in turn cause the frequency anomalies. One of these physical changes involves intermittent contact of certain ground paths with the chassis as the different parts of the assembly come into contact during vibration conditions. Although these surfaces are ideally at the same voltage potential, they are in practice at minutely different voltages, and the shorting caused by the vibrational contact causes changes in the ground currents which in some instances cause the oscillator portion of the electronic module to violate its specification limits.

Although the grommet 24 may be of the same material as the gasket 28, the material of the gasket 28 is relatively expensive, and thus the grommet 24 may be made of an isolation damping thermaplastic, which will provide resistance to tension or compression in the material that are a function of time with shorter time changes in motion resulting in greater resistance to the motion. Such material for grommets can be obtained at a fraction of the cost of the conductive elastomer gasket 28.

Although the manner in which the present invention functions should be obvious from the description thus far, a summary of the operation will be provided. The designator 18 is shown as pointing to a metallic electronic module box. In actuality, only a portion of 18 would normally be solidly encased in metal and the remaining portion of the electronic module package would be printed circuit boards filled with components. The idea being, that the entire module be enclosed within a container, such as the box 14 and the cover 10. The gasket 28 between the cover 10 and the box 14 is conductive and somewhat compressive since it is an elastomer, and will place the cover and the box 14 at the same electric potential in view of the conductive nature of the gasket 28, and will seal the two pieces together to prevent the emission of interfering EMI or RFI signals. The electronic module as represented by box 18 is attached to the cover 10 via the screw 20. The module 18 is electrically at the same potential as cover 10 due to the conductive properties of gasket 28. It is also isolated from the shocks that may be applied to the box 14 or the cover 10 by both the gasket 28 and the grommet 24. The cylinder 26 prevents the compression of the grommet 24 and the gasket 28 to more than a predefined amount. Thus, the resiliency of the two elastomeric materials will not be eliminated by undue compression through tightening of screw 20 relative to nut 30. Due to the construction, the only way in which mechanical impulses can be transmitted to module 18 is by applying these impulses to the screw 20. Although this is a risk which must be taken, it is minimal compared to the surface of the remaining portion of the box. If the application of mechanical impulses to the screw 20 were a serious problem, further protection to these screws in the form of cylinders surrounding the grommet 24 could be installed which would rise to a height of at least as high as the top of screw 20. In this way, even further protection against the application of mechanical impulses to module 18 would be provided. However, the first embodiment utilizing the invention did not require any such additional protection.

While we have illustrated one embodiment of the inventive concept of sealing an electronic module to prevent the emission of EMI and RFI signals, as well as protecting the module from the generation of microphonics signals due to the application of mechanical impulses to the enclosure mechanism, we wish to be limited, not by the single embodiment illustrated and described, but only by the scope of the appended claims, wherein we claim:

1. EMI sealed microphonics isolation apparatus comprising, in combination:
   base first means having an enclosed surface and an outside surface;
   cover second means of a shape to complete a mechanical enclosure of a source of electronically generated interference signals attached to said base first means;
   electronic third means;
   conductive elastomeric gasket fourth means having a durometer hardness rating of between 40 and 70 situated between said first means and said second and third means;
   fastener fifth means for attaching said first means to said second means with enough compressive force being applied to the intermediate fourth means to electrically connect said first and second means and to minimize any EMI signal leakage;
   isolation grommet sixth means; and
   fastener seventh means, cooperating with said third means, for mechanically and electrically attaching said third means to said second means while still maintaining mechanical isolation of said third means and seventh means from said first and second means comprising the enclosure of said third means for shock type impulses, the conductive gasket fourth means preventing the emission of electromagnetic signals from the apparatus.

2. The method of minimizing interference signal leakage from an electronic module enclosed within a container wherein the container has a main portion and a cover portion comprising the steps of:
   electrically connecting and sealing the cover and main portions with a conductive gasket material having a durometer hardness of between 40 and 70 whereby both portions are maintained at the same potential; and
   attaching the module to the cover portion using fasteners having head and shank portions which are mechanically isolated from the cover portion by thermoplastic isolation damping grommets situated between the fastener head and the cover portion where the head and shank portions are solidly connected to the module in a manner to transmit compressive forces from the main portion to the gasket to maintain the module at the same electrical potential as the main portion.

3. The method of shock mounting an electronic module which is mechanically fastened to a first portion of a container whereby microphonics of electronic circuitry in the module within the container due to mechanical shocks applied to the container are minimized while simultaneously minimizing interference signal leakage from the container comprising the steps of:
   inserting a conductive gasket material between all portions of the container to maintain all portions of the container at the same electrical potential; and
   compressing the conductive gasket material between said first portion of the container and the electronic module to maintain the container at the same electric potential as the electronic module using fasteners, having a head and a shank, which are mechanically isolated from the first portion by a mechanical shock damping grommet situated between the fastener head-shank and the first portion.

4. EMI shielding apparatus for an electronic module to be mechanically isolated from its shielding enclosure comprising, in combination:
   a multi-part enclosure comprising a base and at least one other portion wherein each part has mating interfaces;
   conductive gasket means;
   mechanical first attachment means for attaching the parts of the multi-part enclosure to said base with said conductive gasket means being in a compressed state at all interfaces to maintain the entire enclosure at the same electrical potential;
   electronic module means; and
   mechanical second attachment means, including elastomeric mechanical isolation grommet means, for electrically and mechanically attaching said electronic module means to said base via said conductive gasket means while providing mechanical isolation, between said base and said electronic module, to mechanical oscillation inducing impulses whereby microphonics generation in the module is minimized.

5. Apparatus of the class described comprising, in combination:
   base first means having an enclosed surface and an outside surface;
   cover second means of a shape to complete a mechanical enclosure of any source of electronically generated interference signals attached to said base first means;
   electronic third means;

conductive elastomeric gasket fourth means situated between said first means and said second and third means;

fastener fifth means for attaching said first means to said second means with enough compressive force being applied to the intermediate fourth means to electrically connect said first and second means and to minimize any interference signal leakage; and fastener sixth means, cooperating with said third means, for mechanically and electrically attaching said third means to said second means; the conductive gasket fourth means preventing the emission of electromagnetic signals from the apparatus.

* * * * *